US012754235B2

(12) United States Patent
Viswanathan

(10) Patent No.: US 12,754,235 B2
(45) Date of Patent: Oct. 6, 2026

(54) I3C ERROR STATES TEST STRATEGY

(71) Applicant: Microchip Technology Incorporated, Chandler, AZ (US)

(72) Inventor: Vivek Viswanathan, Chennai (IN)

(73) Assignee: Microchip Technology Incorporated, Chandler, AZ (US)

( * ) Notice: Subject to any disclaimer, the term of this patent is extended or adjusted under 35 U.S.C. 154(b) by 68 days.

(21) Appl. No.: 19/040,167

(22) Filed: Jan. 29, 2025

(65) Prior Publication Data

US 2026/0118421 A1 Apr. 30, 2026

(30) Foreign Application Priority Data

Oct. 31, 2024 (IN) ............................ 202441083598

(51) Int. Cl.
*G01R 31/317* (2006.01)
*G01R 31/3185* (2006.01)

(52) U.S. Cl.
CPC . *G01R 31/31723* (2013.01); *G01R 31/31727* (2013.01); *G01R 31/318569* (2013.01)

(58) Field of Classification Search
None
See application file for complete search history.

(56) References Cited

PUBLICATIONS

International Search Report & Written Opinion issued on Jun. 2, 2025, in corresponding International Application No. PCT/US2025/018434 (12 pages).

Anonymous: "PGY-I3C-EX-PD and PGY-I3C-EX-PD Lite I3C Protocol Exerciser and Analyzer", Feb. 21, 2020, Retrieved from the Internet: URL: https://www.prodigytechno.com/device/i2c-spi-protocol-analyzer; retrieved on May 21, 2025 (6 pages).

MIPI Alliance: "Specification for I3C Basic", Jul. 19, 2018, Retrieved from the Internet: URL: https://www.mipi.org/; retrieved on Sep. 24, 2020 (172 pages).

Gao Peng, et al: "Design Implementation and Verification of a Flexible I3C Hardware Architecture", 2024 13th International Conference on Communications, Circuits and Systems (ICCCAS), IEEE, May 10, 2024, pp. 148-153, DOI: 10.1109/ICCCAS62034.2024.10652810, retrieved on Sep. 5, 2024 (6 pages).

*Primary Examiner* — Guerrier Merant
(74) *Attorney, Agent, or Firm* — Shumaker, Loop & Kendrick, LLP; Ryan M. Corbett

(57) ABSTRACT

An integrated circuit (IC) for testing an I3C device is provided. The IC may include a start/stop detection logic block to receive a serial data line (SDA) signal and a serial clock line (SCL) signal, and output a start detection signal and a stop detection signal, a SCL counter block to receive the SCL signal and the start and stop detection signals, and output a SCL count value, a SCL positive edge detection signal, and a SCL negative edge detection signal, a SDA inversion logic block to receive the SCL count value, a SCL programmed count value, and the SCL positive and negative edge detection signals, and output a SDA invert enable signal based on a comparison of the SCL count value and the SCL programmed count value, and a multiplexer to receive the SDA invert enable signal, and output the SDA signal or an inverted SDA signal.

20 Claims, 3 Drawing Sheets

I3C ERROR STATES TEST STRATEGY

CROSS-REFERENCE TO RELATED APPLICATION

The present application claims priority to Indian Provisional Patent Application No. 202441083598, entitled: I3C Error States Test Strategy, filed on Oct. 31, 2024, the contents of which are hereby incorporated by reference in their entirety.

TECHNICAL FIELD

The present disclosure relates generally to the MIPI I3C (Mobile Industry Processor Interface Inter-Integrated Circuit) bus protocol, and more specifically to an integrated circuit and method for testing I3C devices.

SUMMARY

According to an aspect of one or more examples, there is provided an integrated circuit (IC) for testing an I3C device. The IC may include a start/stop detection logic block to receive a serial data line (SDA) signal and a serial clock line (SCL) signal, and output a start detection signal and a stop detection signal, a SCL counter block to receive the SCL signal and the start and stop detection signals, and output a SCL count value, a SCL positive edge detection signal, and a SCL negative edge detection signal, a SDA inversion logic block to receive the SCL count value, a SCL programmed count value, and the SCL positive and negative edge detection signals, and output a SDA invert enable signal based on a comparison of the SCL count value and the SCL programmed count value, and a multiplexer to receive the SDA signal, an inverted SDA signal, and the SDA invert enable signal, and output the SDA signal or the inverted SDA signal based on the SDA invert enable signal. The start/stop detection logic block may output the start detection signal in response to detecting a start condition to enable the SCL counter block, and output the stop detection signal in response to detecting a stop condition to reset the SCL counter block. The start condition may be based on a $t_{cas}$ (Clock After START Condition) parameter, and the stop condition may be based on a $t_{cbp}$ (Clock Before STOP Condition) parameter. The SCL counter block may increment the SCL count value when the SCL positive edge detection signal is high. The SCL positive edge detection signal may be high when a low-to-high transition of the SCL signal is detected, and the SCL negative edge detection signal may be high when a high-to-low transition of the SCL signal is detected. The IC may also include a register to store the SCL programmed count value. The SDA inversion logic block may compare the SCL programmed count value to the SCL count value. The SDA invert enable signal may be high in response to the SDA inversion logic block receiving a high SCL negative edge detection signal after the SCL count value equals the SCL programmed count value minus one, and may be low in response to the SDA inversion logic block receiving a high SCL negative edge detection signal after the SCL count value equals the SCL programmed count value. The multiplexer may output the inverted SDA signal when the SDA invert enable signal is high, and output the SDA signal when the SDA invert enable signal is low. The IC may produce at least one of a CE1 controller error state and TE0 through TE6 target error states based on the SDA signal. The SCL programmed count value may be based on an error state for testing.

According to an aspect of one or more examples, there is provided a method for testing an I3C device. The method may include receiving, at a start/stop detection logic block, a serial data line (SDA) signal and a serial clock line (SCL) signal, outputting, from the start/stop detection logic block, a start detection signal and a stop detection signal, receiving, at a SCL counter block, the SCL signal and the start and stop detection signals, outputting, from the SCL counter block, a SCL count value, a SCL positive edge detection signal, and a SCL negative edge detection signal, receiving, at a SDA inversion logic block, the SCL count value, a SCL programmed count value, and the SCL positive and negative edge detection signals, outputting, from the SDA inversion block, a SDA invert enable signal based on a comparison of the SCL count value and the SCL programmed count value, receiving, at a multiplexer, the SDA signal, an inverted SDA signal, and the SDA invert enable signal, and outputting, from the multiplexer, the SDA signal or the inverted SDA signal based on the SDA invert enable signal. The start-stop detection logic block may output the start detection signal in response to detecting a start condition to enable the SCL counter block, and output the stop detection signal in response to detecting a stop condition to reset the SCL counter block. The start condition may be based on a $t_{cas}$ (Clock After START Condition) parameter, and the stop condition may be based on a $t_{cbp}$ (Clock Before STOP Condition) parameter. The method may also include incrementing, by the SCL counter block, the SCL count value when the SCL positive edge detection signal is high. The SCL positive edge detection signal may be high when a low-to-high transition of the SCL signal is detected, and the SCL negative edge detection signal may be high when a high-to-low transition of the SCL signal is detected. The method may also include storing, at a register, the SCL programmed count value. The comparison of the SCL programmed count value and the SCL count value may be performed by the SDA inversion logic block. The SDA invert enable signal may be high in response to the SDA inversion logic block receiving a high SCL negative edge detection signal after the SCL count value equals the SCL programmed count value minus one, and may be low in response to the SDA inversion logic block receiving a high SCL negative edge detection signal after the SCL count value equals the SCL programmed count value. The multiplexer may output the inverted SDA signal when the SDA invert enable signal is high, and output the SDA signal when the SDA invert enable signal is low.

DETAILED DESCRIPTION OF VARIOUS EXAMPLES

Figure 1:
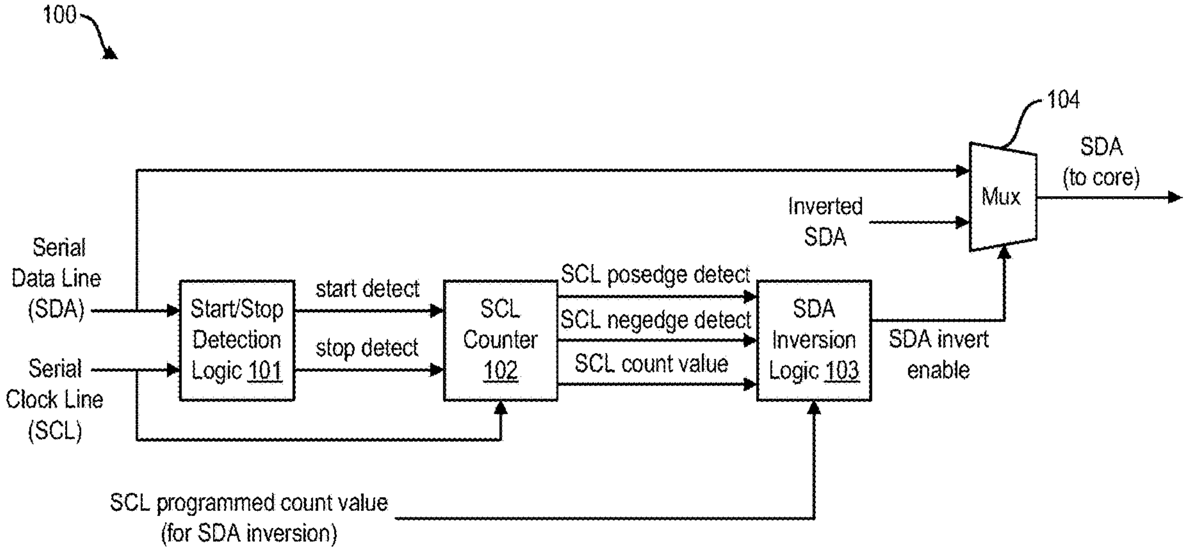
FIG. 1 shows a circuit diagram of an integrated circuit (IC) for testing an I3C device according to one or more examples.

Reference will now be made in detail to the following various examples, which are illustrated in the accompanying drawings, wherein like reference numerals refer to like elements throughout. The following examples may be embodied in various forms without being limited to the examples set forth herein.

The MIPI I3C (Mobile Industry Processor Interface Inter-Integrated Circuit) bus protocol may facilitate communication between Controllers and Targets via high-speed data transfer. However, unintended contention between Controller and Target may result in damage of the Controller and Target if the RnW bit received by the Target is not the same as what the Controller transmitted.

The MIPI I3C Specification (Section 5.1.10.2, version v1-1-1-er0) defines the CE1 error state for the Controller, which may be entered when the transmitted data does not match the intended data. Similarly, the specification outlines error states for Targets, labeled TE0 through TE6, which may vary based on the location of bit errors within the I3C packet (Section 5.1.10.1). Testing for these error states may ensure I3C compliance and robust error handling, especially as customers increasingly demand reliable error detection and response in I3C-compliant products.

Testing these errors may present technical challenges. For example, simulating a CE1 error may require deliberate corruption of transmitted data at specific bit positions—such as the RnW (Read/Write) Bit, Data Byte, or Parity Bit. Achieving such conditions through external circuitry may be both complex and potentially damaging to the Device Under Test (DUT), as it requires driving the bus to different values than intended, risking device integrity.

Testing for Target error states (TE0-TE6) may involve the use of an I3C analyzer to generate traffic with controlled errors. However, I3C analyzers may be expensive, costing approximately $8,000 per unit, and require extensive programming to simulate targeted erroneous conditions. Additionally, certain error scenarios may demand simultaneous erroneous driving by both the Controller and Target, a condition that can be challenging to achieve using conventional external circuitry or analyzers. Therefore, there may exist a need for a simpler, more reliable testing method that does not require complex external setups.

FIG. 1 shows a circuit diagram of an integrated circuit (IC) 100 for testing an I3C device according to one or more examples. As shown in FIG. 1, the IC 100 may include a start/stop detection logic block 101, a SCL counter block 102, a SDA inversion logic block 103, and a multiplexer (MUX) 104.

The start/stop detection logic block 101 may receive a serial data line (SDA) signal and a serial clock line (SCL) signal. The start/stop detection logic block 101 may output a start detection signal and a stop detection signal. According to one or more examples, the start/stop detection block 101 may output the start detection signal when a start condition is detected to enable the SCL counter block 102, and output the stop detection signal when a stop condition is detected to reset the SCL counter block 102. According to one or more examples, the start condition may be a high-to-low transition of the SDA signal while the SCL signal is at a constant high level, and the stop condition may be a low-to-high transition of the SDA signal while the SCL signal is at a constant high level. According to one or more examples, the start condition may be based on a $t_{cas}$ (Clock After START Condition) parameter, and the stop condition may be based on a $t_{cbp}$ (Clock Before STOP Condition) parameter. The $t_{cas}$ and $t_{cbp}$ parameters may be defined by the MIPI I3C Specification (Table 110). The $t_{cas}$ parameter may be the timing between the SDA signal falling below approximately 0.3VDD and the SCL signal falling below approximately 0.7VDD. The $t_{cbp}$ parameter may be the timing between the SCL signal rising above approximately 0.7VDD and the SDA signal rising above 0.3VDD.

The SCL counter block 102 may receive the SCL signal and the start and stop detection signals. The SCL counter block 102 may output a SCL count value, a SCL positive edge detection signal, and a SCL negative edge detection signal. According to one or more examples, the SCL counter block 102 may increment the SCL count value when the SCL positive edge detection signal is high. According to one or more examples, the SCL positive edge detection signal may be high when a low-to-high transition of the SCL signal is detected, and the SCL negative edge detection signal may be high when a high-to-low transition on the SCL is detected.

The SDA inversion logic block 103 may receive the SCL count value, a SCL programmed count value, and the SCL positive and negative edge detection signals. The SDA inversion logic block 103 may output a SDA invert enable signal based on a comparison of the SCL count value and the SCL programmed count value. According to one or more examples, the IC 100 may include a register (not shown in FIG. 1) to store the SCL programmed count value. The SDA inversion logic block 103 may retrieve the SCL programmed count value from the register. According to one or more examples, the SCL programmed count value may be based on an error state for testing. For example, to test an error state corresponding to a sixth bit error in the I3C packet, a value of six may be assigned to the SCL programmed count value. According to one or more examples, the SDA inversion logic block 103 may compare the SCL programmed count value to the SCL count value. According to one or more examples, the SDA invert enable signal may be high when the SCL programmed count value equals the SCL count value minus one and low for any other count value. According to one or more examples, the SDA invert enable signal may be high in response to the SDA inversion logic block 103 receiving a high negative edge detection signal after the SCL count value equals the SCL programmed count value minus one, and may be low in response to the SDA inversion logic block 103 receiving a high negative edge detection signal after the SCL count value equals the SCL programmed count value. A high SDA invert enable signal may indicate that a "Test Mode" for the IC 100 has been enabled. Conversely, a low SDA invert enable signal may indicate that the "Test Mode" for the IC 100 has been disabled. According to one or more examples, the SDA inversion logic block 103 may invert the SDA signal, and output the inverted SDA signal to the multiplexer 104. According to one or more examples, the inverted SDA signal may be generated by an inverter or other suitable circuit or device, and output as the inverted SDA signal to the multiplexer 104.

The multiplexer 104 may receive the SDA signal, an inverted SDA signal, and the SDA invert enable signal. The multiplexer 104 may output the SDA signal or the inverted SDA signal based on the SDA invert enable signal. According to one or more examples, the multiplexer 104 may output the inverted SDA signal when the SDA invert enable signal is high, and output the SDA signal when the SDA invert enable signal is low. The SDA signal or inverted SDA signal output by the multiplexer 104 may be provided as input to the I3C IP core. According to one or more examples, the IC 100 may produce at least one of a CE1 controller error state and TE0 through TE6 target error states on the SDA signal. The I3C IP core may include an error detection circuit to detect the error state on the SDA signal produced by the integrated circuit 100.

Figure 2:
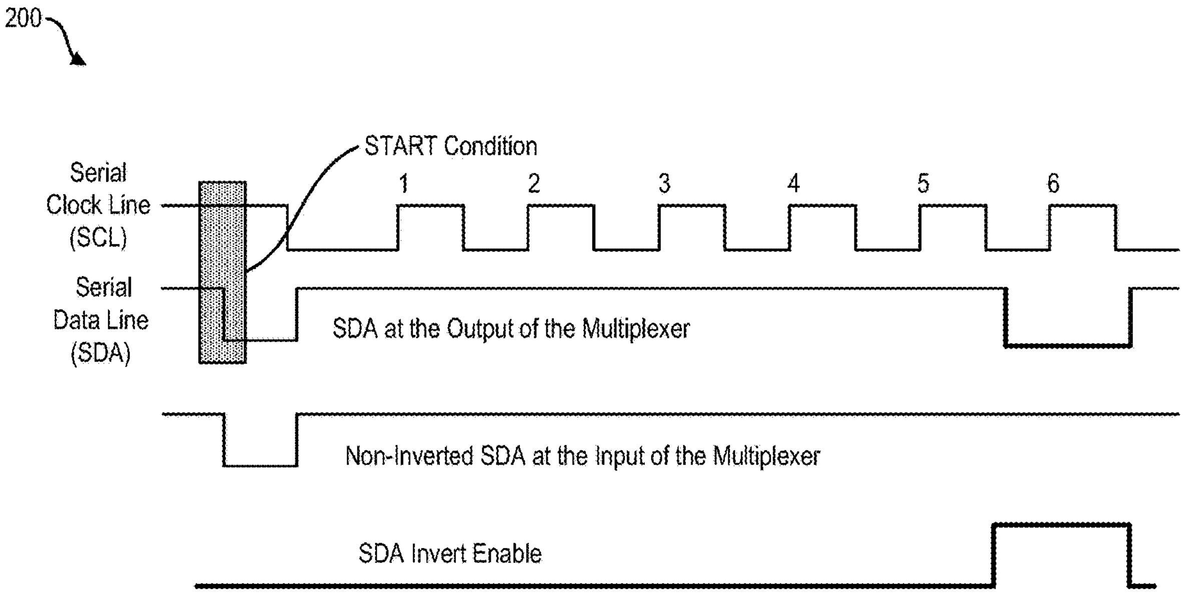
FIG. 2 shows a timing diagram of an IC that produces an error state corresponding to a sixth bit error on the SDA according to FIG. 1.

FIG. 2 shows a timing diagram 200 of the IC 100 that produces an error state corresponding to a sixth bit error on the SDA according to FIG. 1. As discussed above, the start/stop detection logic block 101 may output a start detection signal upon detection of a start condition to enable the SCL counter block 102. The start/stop detection logic block 101 may output a stop detection signal upon detection of a stop condition to reset the SCL counter block 102. As shown in FIG. 2, the start condition (e.g., START Condition) may be a high-to-low transition of the SDA signal while the SCL signal is at a constant high level. Once enabled, the SCL counter block 102 may begin counting clock cycles of the SCL signal by incrementing a SCL count value. The SCL counter block 102 may increment the SCL count value in response to detecting that a SCL positive edge detection signal is high. The SCL positive edge detection signal may be high when a low-to-high transition of the SCL signal is detected. A SCL negative edge detection signal may be high when a high-to-low transition of the SCL signal is detected. The SCL counter block 102 may output the SCL positive and negative edge detection signals and the SCL count value. The SDA inversion logic block may receive the SCL positive and negative edge detection signals, the SCL count value, and a SCL programmed count value. The SCL programmed count value may be stored in a register. The SCL programmed count value may be based on an error state for testing. In FIG. 2, the SCL programmed count value may be six because the IC 100 produces an error state corresponding to a sixth bit error on the SDA. The SDA invert enable signal may be high between the immediate preceding and succeeding falling edges of the SCL programmed count value (e.g., at the sixth clock cycle of the SCL). More specifically, the SDA invert enable signal may be asserted in response to the SDA inversion logic block 103 detecting a negative edge (e.g., SCL negative edge detection signal is high) when the SCL count value is equal to the SCL programmed count value minus one (e.g., SCL count value=6−1=5, which corresponds to the fifth clock cycle of the SCL). The SDA invert enable signal may be disabled in response to the SDA inversion logic block 103 detecting a negative edge (e.g., SCL negative edge detection signal is high) when the SCL count value is equal to the SCL programmed count value (e.g., SCL count value=6, which corresponds to the sixth clock cycle of the SCL). As shown in FIG. 2, the SDA invert enable signal may be high between the falling edge of the fifth clock cycle of the SCL and the falling edge of the sixth clock cycle of the SCL. The SDA inversion logic block 103 may transmit the SDA invert enable signal to the multiplexer 104. The non-inverted SDA signal may also be transmitted as input to the multiplexer 104. The multiplexer 104 may output an inverted SDA signal when the SDA invert enable signal is high, and output the SDA signal when the SDA invert enable signal is low.

Figure 3:
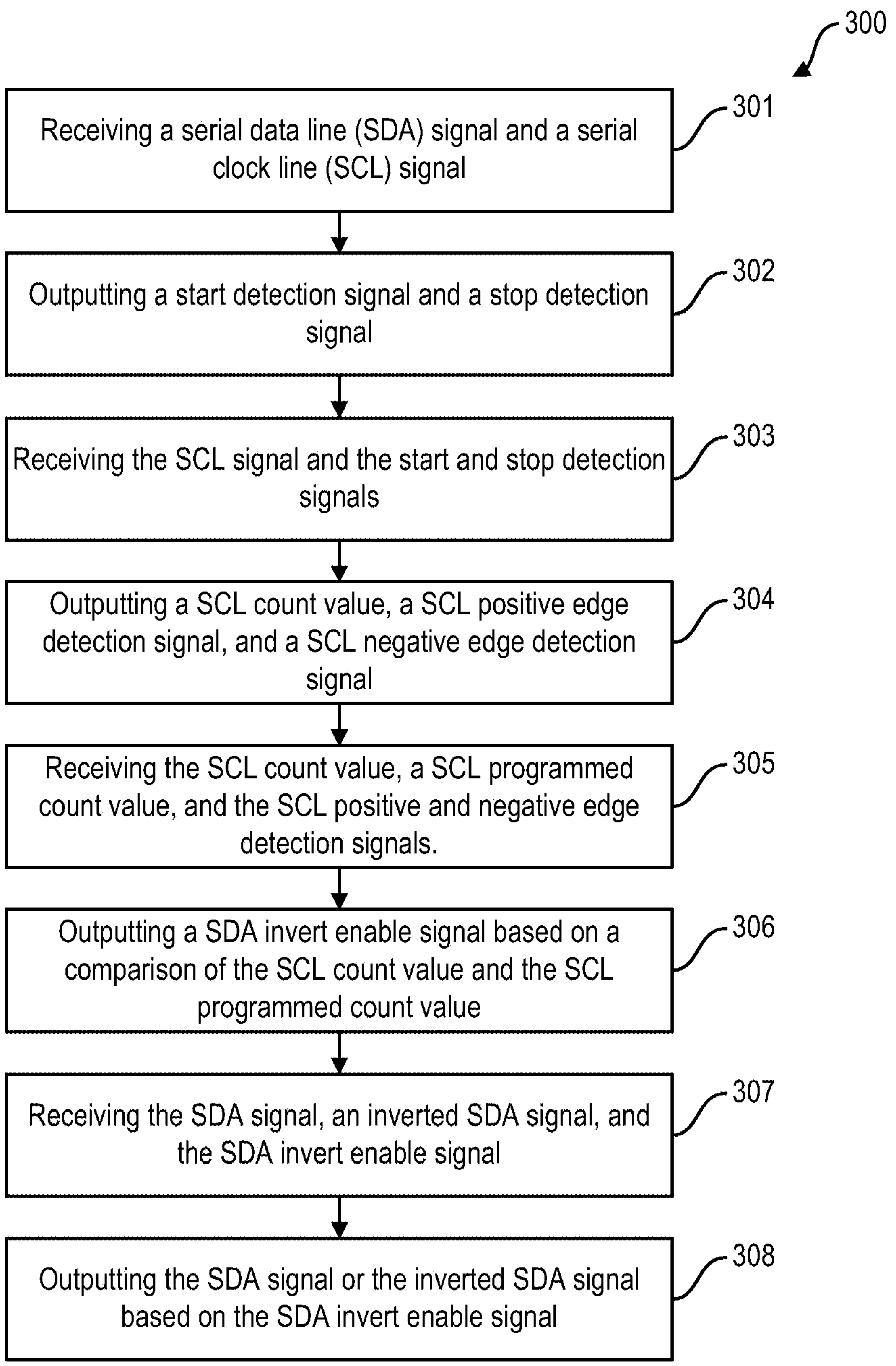
FIG. 3 shows a flow chart of a method for testing an I3C device according to one or more examples.

FIG. 3 shows a flow chart of a method 300 for testing an I3C device. As shown in FIG. 3, the method 300 may include receiving 301, at a start/stop detection block, a serial data line (SDA) signal and a serial clock line (SCL) signal. The method 300 may include outputting 302, from the start/stop detection logic block, a start detection signal and a stop detection signal. The method 300 may include receiving 303, at a SCL counter block, the SCL signal and the start and stop detection signals. The method 300 may include outputting 304, from the SCL counter block, a SCL count value, a SCL positive edge detection signal, and a SCL negative edge detection signal. The method 300 may include receiving 305, at a SDA inversion logic block, the SCL count value, a SCL programmed count value, and the SCL positive and negative edge detection signals. The method 300 may include outputting 306, from the SDA inversion block, a SDA invert enable signal based on a comparison of the SCL count value and the SCL programmed count value. The method 300 may include receiving 307, at a multiplexer, the SDA signal, an inverted SDA signal, and the SDA invert enable signal. The method 300 may include outputting 308, from the multiplexer, the SDA signal or the inverted SDA signal based on the SDA invert enable signal.

Various examples have been disclosed herein, in connection with the above description and the drawings. It will be understood that it would be unduly repetitious to literally describe and illustrate every combination and subcombination of these examples. Accordingly, all examples can be combined in any way or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. An integrated circuit (IC) for testing an I3C device, the IC comprising:

a start/stop detection logic block to receive a serial data line (SDA) signal and a serial clock line (SCL) signal, and output a start detection signal and a stop detection signal;

a SCL counter block to receive the SCL signal and the start and stop detection signals, and output a SCL count value, a SCL positive edge detection signal, and a SCL negative edge detection signal;

a SDA inversion logic block to receive the SCL count value, a SCL programmed count value, and the SCL positive and negative edge detection signals, and output a SDA invert enable signal based on a comparison of the SCL count value and the SCL programmed count value; and a multiplexer to receive the SDA signal, an inverted SDA signal, and the SDA invert enable signal, and output the SDA signal or the inverted SDA signal based on the SDA invert enable signal.

2. The IC of claim 1, wherein the start/stop detection logic block is to output the start detection signal in response to detecting a start condition to enable the SCL counter block, and output the stop detection signal in response to detecting a stop condition to reset the SCL counter block.

3. The IC of claim 2, wherein the start condition is based on a $t_{cas}$ (Clock After START Condition) parameter, and the stop condition is based on a $t_{cbp}$ (Clock Before STOP Condition) parameter.

4. The IC of claim 1, wherein the SCL counter block is to increment the SCL count value when the SCL positive edge detection signal is high.

5. The IC of claim 4, wherein the SCL positive edge detection signal is high when a low-to-high transition of the SCL signal is detected, and the SCL negative edge detection signal is high when a high-to-low transition of the SCL signal is detected.

6. The IC of claim 5, further comprising a register to store the SCL programmed count value.

7. The IC of claim 6, wherein the SDA inversion logic block is to compare the SCL programmed count value to the SCL count value.

8. The IC of claim 7, wherein the SDA invert enable signal is high in response to the SDA inversion logic block receiving a high SCL negative edge detection signal after the SCL count value equals the SCL programmed count value minus one, and is low in response to the SDA inversion logic block receiving a high SCL negative edge detection signal after the SCL count value equals the SCL programmed count value.

9. The IC of claim 1, wherein the multiplexer is to output the inverted SDA signal when the SDA invert enable signal is high, and output the SDA signal when the SDA invert enable signal is low.

10. The IC of claim 1, wherein the IC is to produce at least one of a CE1 controller error state and TE0 through TE6 target error states based on the SDA signal.

11. The IC of claim 10, wherein the SCL programmed count value is based on an error state for testing.

12. A method for testing an I3C device, the method comprising:

receiving, at a start/stop detection logic block, a serial data line (SDA) signal and a serial clock line (SCL) signal;

outputting, from the start/stop detection logic block, a start detection signal and a stop detection signal;

receiving, at a SCL counter block, the SCL signal and the start and stop detection signals;

outputting, from the SCL counter block, a SCL count value, a SCL positive edge detection signal, and a SCL negative edge detection signal;

receiving, at a SDA inversion logic block, the SCL count value, a SCL programmed count value, and the SCL positive and negative edge detection signals;

outputting, from the SDA inversion block, a SDA invert enable signal based on a comparison of the SCL count value and the SCL programmed count value;

receiving, at a multiplexer, the SDA signal, an inverted SDA signal, and the SDA invert enable signal; and outputting, from the multiplexer, the SDA signal or the inverted SDA signal based on the SDA invert enable signal.

13. The method of claim 12, wherein the start-stop detection logic block is to output the start detection signal in response to detecting a start condition to enable the SCL counter block, and output the stop detection signal in response to detecting a stop condition to reset the SCL counter block.

14. The method of claim 13, wherein the start condition is based on a $t_{cas}$ (Clock After START Condition) parameter, and the stop condition is based on a $t_{cbp}$ (Clock Before STOP Condition) parameter.

15. The method of claim 12, further comprising:

incrementing, by the SCL counter block, the SCL count value when the SCL positive edge detection signal is high.

16. The method of claim 15, wherein the SCL positive edge detection signal is high when a low-to-high transition of the SCL signal is detected, and the SCL negative edge detection signal is high when a high-to-low transition of the SCL signal is detected.

17. The method of claim 16, further comprising:

storing, at a register, the SCL programmed count value.

18. The method of claim 17, wherein the comparison of the SCL programmed count value and the SCL count value is performed by the SDA inversion logic block.

19. The method of claim 18, wherein the SDA invert enable signal is high in response to the SDA inversion logic block receiving a high SCL negative edge detection signal after the SCL count value equals the SCL programmed count value minus one, and is low in response to the SDA inversion logic block receiving a high SCL negative edge detection signal after the SCL count value equals the SCL programmed count value.

20. The method of claim 12, wherein the multiplexer is to output the inverted SDA signal when the SDA invert enable signal is high, and output the SDA signal when the SDA invert enable signal is low.

* * * * *